United States Patent
Bernstein et al.

(10) Patent No.: US 6,577,178 B1
(45) Date of Patent: Jun. 10, 2003

(54) TRANSIENT GATE TUNNELING CURRENT CONTROL

(75) Inventors: Kerry Bernstein, Underhill, VT (US); Peter E. Cottrell, Essex Junction, VT (US); Edward J. Nowak, Essex Junction, VT (US); Norman J. Rohrer, Underhill, VT (US); Douglas W. Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,504

(22) Filed: Jul. 23, 2002

(51) Int. Cl.$^7$ ............................................... H03K 17/30
(52) U.S. Cl. .......................... 327/382; 326/15; 326/121
(58) Field of Search .................................. 327/382, 544; 326/15, 31, 121; 365/185.24, 185.28, 185.17; 257/296

(56) References Cited

U.S. PATENT DOCUMENTS

| | | | | |
|---|---|---|---|---|
| 4,277,782 A | * | 7/1981 | Chao | 340/661 |
| 5,461,265 A | * | 10/1995 | Kunihisa et al. | 307/98 |
| 5,644,266 A | * | 7/1997 | Chen et al. | 327/534 |
| 6,424,015 B1 | * | 7/2002 | Ishibashi et al. | 257/391 |

* cited by examiner

Primary Examiner—Tuan T. Lam
(74) Attorney, Agent, or Firm—McGinn & Gibb, PLLC; Richard A. Henkler, Esq.

(57) ABSTRACT

A circuit includes a resistance-capacitance (RC) structure connected to a first set of transistors and a second set of transistors that perform the same logical function as the first set of transistors. The first set of transistors have thinner gate oxides than the second set of transistors. The RC structure drains an electric field from the first set of transistors, such that the first set of transistors are on only during initial transistor switching. In other words, the RC structure turns off the first set of transistors after transistor switching is completed. Also, the first set of transistors and the second set of transistors share common inputs and outputs. The first set of transistors exhibit higher tunneling currents than the second set of transistors. The thinner gate oxides of the first set of transistors cause the first set of transistors to exhibit higher device currents than the second set of transistors. The RC structure includes a capacitor connected to a gate of the first set of transistors and a resistor connected to the capacitor and to ground.

20 Claims, 6 Drawing Sheets

TRANSIENT GATE TUNNELING CURRENT CONTROL

BACKGROUND OF THE INVENTION

1. Field of the Invention

The present invention generally relates to semiconductor integrated circuit design, and more particularly to a semiconductor integrated circuit that provides the performance associated with thin oxide transistors with the reduced tunneling current associated with thick oxide transistors.

2. Description of the Related Art

A challenge facing circuit designers is how to continue to improve circuit performance with the adverse effects of continued device scaling. If the designer scales the gate oxide to below 1.3 nm, the results are disappointing and the circuit has very high tunneling currents from the gate to the inversion layer and to the body or substrate. Moreover, tunneling currents above 100 A/cm$^2$ makes the standby power excessive for many applications.

Thin oxide transistors operate at a much higher speed than thick oxide transistors. However, thin oxide transistors suffer significantly higher tunneling currents than thick oxide transistors. Therefore, designers have had to choose between using lower performance thick oxide transistors (to reduce standby power consumption) and thin oxide transistors (to increase performance when designing circuits).

Some conventional solutions, which aim to avoid the negative effects of tunneling current of thin oxide transistors only apply to one dynamic logic family, thereby limiting the applications of the design. Moreover, these prior art solutions also result in trading off active power for passive power, a result which is both undesirable and limiting.

In U.S. Pat. No. 5,644,266 issued to Chen et al., "Dynamic Threshold Voltage Scheme for Low Voltage CMOS Inverter," the complete disclosure of which is herein incorporated by reference, it is described that the bodies of conventional static circuits along with the gates of the FETs are connected through a series of blocking capacitors with a resistor (of high value) from body to source. In this conventional design, the current-drawing input (the body) is momentarily biased into conduction in order to enable faster switching of the device, and then is allowed to relax to a low current state. However, one of the major drawbacks of this and other conventional devices is that this method of body-voltage modulation produces substantially deficient drive gains.

Thus, there is a need for a semiconductor integrated circuit that provides the performance associated with thin oxide transistors with the reduced tunneling current associated with thick oxide transistors and a circuit design which achieves much greater drive gains than can be achieved by body-voltage modulation alone. Moreover, there is a need for a novel circuit design which is much broader in its application, for example, one which can also be applied to multi-dynamic logic families. Furthermore, there is a need for a simple, yet effective circuit which reduces the active-power-for-passive-power-trade-off.

BRIEF SUMMARY OF THE INVENTION

In view of the foregoing and other problems, disadvantages, and drawbacks of the conventional circuit designs the present invention has been devised, and it is an object of the present invention to provide a structure and method for a semiconductor integrated circuit with tunneling current control. Yet another object of the present invention is to provide a semiconductor integrated circuit design which has a broad application, for example, one which can be applied to multiple dynamic logic families. It is still another object of the present invention to provide a simple, yet effective circuit which reduces the active-power for passive-power trade-off.

In order to attain the objects suggested above, there is provided, according to one aspect of the invention a circuit that includes a resistance-capacitance (RC) structure connected to a first set of transistors and a second set of transistors that perform the same logical function as the first set of transistors. The first set of transistors have thinner gate oxides than the second set of transistors. The RC structure drains an electric field from the first set of transistors, such that the first set of transistors are on, in parallel with the second set of transistors, only during initial transistor switching. The thin oxide devices are stronger and pass more current (e.g, have performance). The interest in the thin oxide devices is the increased device current arising from their stronger coupling to the inversion channel. The thin oxide devices are pulsed on only during the transition period, leaving the thick oxide devices on after the transition period to maintain level current for the remainder of the cycle. The motivation is to turn the thin oxide devices off to cut tunneling current during inactivity. Also, the first set of transistors and the second set of transistors share common inputs and outputs. The RC structure includes a capacitor connected to a gate of the first set of transistors and a resistor connected to the capacitor and to ground.

Thus, according to the present invention, a new circuit design is disclosed which allows for much higher-performance thin-oxide MOSFETs to momentarily switch to achieve much greater drive gains than can be achieved by devices using only thicker oxides which avoid tunneling leakage current.

There are several benefits of the present invention. First, the invention provides a semiconductor integrated circuit that has the performance associated with thin oxide transistors and the reduced tunneling current associated with thick oxide transistors. The present invention has a broad application because, as would be known by one ordinarily skilled in the art given the following disclosure, the invention can be applied to dynamic logic families. Moreover, the present invention provides a simple, yet effective circuit which results in reducing the active-power for passive-power trade-off.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

DETAILED DESCRIPTION OF PREFERRED EMBODIMENTS OF THE INVENTION

Figure 1:
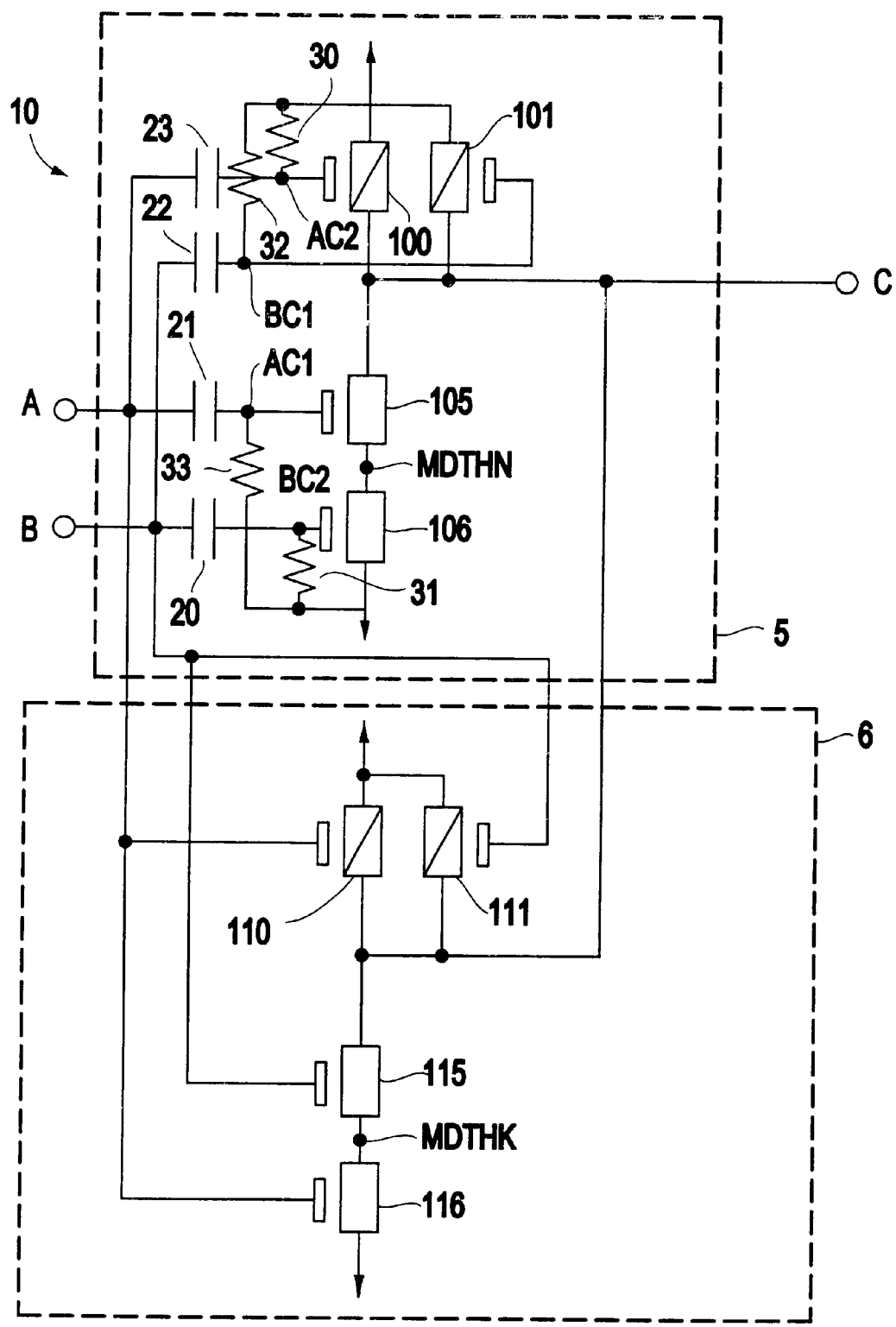
FIG. 1 is a schematic diagram of a circuit according to the present invention.

As mentioned there is a problem with conventional designs that choose between using lower performance thick oxide transistors (to reduce standby power consumption) and thin oxide transistors (to increase performance when designing circuits). If the designer scales the gate oxide to below 1.3 nm (sub 0.9V), the results are disappointing because the circuit has very high tunneling currents from the gate to the inversion layer. Moreover, having tunneling currents above 100 A/cm$^2$ results in unmanageable standby power.

With the present invention described below, a semiconductor integrated circuit is provided that has the performance associated with thin oxide transistors and the reduced tunneling current associated with thick oxide transistors. According to the present invention, the circuit controls the gate tunneling current by providing a first circuit having thin oxide devices that briefly achieve a given logic function, and a second identical circuit having thick oxide devices executing the same logic function (in parallel with the first circuit) and that continue the logical function after the thin oxide devices have turned off. The second parallel circuit uses thick-oxide gate insulator devices instead of thin oxide devices to restrict tunneling and reduce standby power consumption. The invention uses a resistor-capacitor structure to limit the time that the thin oxide devices are active, which minimizes the time when a high electric field exists across the thin oxide gate insulator. The thin oxide devices are active only during initial transistor switching, in order to minimize gate oxide tunneling current leakage.

Duty factor in this description refers to the percentage of the total cycle time in which a high electric field exists across a given device's gate insulator. An electric field is considered high when the voltage across the insulator approaches the supply voltage $V_{dd}$ for that component. Typically, the duty factor in conventional static combinatorial CMOS logic can be quite high, due to the probability that a given input is not required to reset or change from cycle to cycle. us, the present invention minimizes the high-field interval with high or low activity. This is accomplished by allowing the transient signal to briefly power up the thin gates and then allowing the added resistor to restore the field across the thin gate insulator to a low potential after transistor switching has occurred.

Each of the thin-oxide devices is equipped with a resistor and a capacitor coupled to the input gate. The first terminal of the resistor is tied directly to the input gate of the device. The second terminal of the resistor is tied to the reference plane of the transistor. The reference plane for an NMOSFET is "Ground" (GND), and the reference plane for a PMOSFET is the supply voltage plane "$V_{dd}$". The first terminal of the capacitor is also tied to the transistor's input gate, and the second terminal of the capacitor is tied to the intended input signal source feeding the transistor.

In this manner, a resistor-capacitor "RC" circuit is formed, which transforms an intended static input level into a voltage spike which rises instantaneously with the intended signal input, but returns to the device's reference plane at a rate defined by the product of the resistance and capacitance used. Generally, 90% of the transition back down will occur in a time delay of 2.2 times the RC product. Preferably, the value of capacitance used should be minimized, and the value of resistance maximized, to achieve a spike which lasts for only a fraction of the total cycle time. Moreover, this transient circuit generator is applied for both transition polarities. A parallel static thick oxide ghost of the high-speed circuit but with reduced device widths both maintains the data integrity and restores the thin MOSFET circuit.

Referring now to the drawings, and more particularly to FIG. 1, there is shown one example of the present invention. In general, FIG. 1 illustrates thin oxide transistors that are operated only briefly (as controlled by RC circuits) and thick oxide transistors that continue the logical operation of the thin oxide transistors after the thin oxide transistors are turned off by the RC circuits. While one specific example is shown in FIG. 1, the invention is broadly applicable to all devices that could benefit from thin oxide transistors, yet which need the reduced tunneling current associated with thick oxide transistors. Therefore, the invention is not limited to the specific structure shown in FIG. 1, and one ordinarily skilled in the art would understand that the invention is broadly applicable to any form of integrated circuit device.

FIG. 1 illustrates an ultra-thin transient MOSFET static circuit 10 shown in a static 2W NAND format. Referring to the circuit in FIG. 1, resistors 30, 31, 32, 33 and capacitors 20, 21, 22, 23 form the various RC circuits. As depicted in the circuit diagram, there are two embodiments (portions) of the 2W NAND, the thin oxide embodiment with attending transient generator in subcircuit 5, and the thick oxide embodiment in subcircuit 6. Subcircuit 5 comprises thin oxide PMOSFET device pair 100, 101, and thin oxide NMOSFET device pair 105, 106, and resistors 30, 31, 32, 33 and capacitors 20, 21, 22, 23; and subcircuit 6 comprises thick oxide PMOSFET device pair 110, 111, and thick oxide NMOSFET device pair 115, 116.

Preferably, the input capacitors 20, 21, 22, 23 each have a capacitance equaling many times the capacitance of the gate dielectric of the MOSFETs 100, 101, 105, 106, 110, 111, 115, 116 in order to avoid the loss of the drive signal across the input capacitors 20, 21, 22, 23. The natural capacitance of the gate dielectric is seen as the parallel-plate formed with the gate electrode as one terminal, the substrate and inversion channel as the second terminal, and the gate insulator as the dielectric between the two plates. There are no discrete capacitors built in for an RC effect on the thick oxide parallel circuits. There exists, however, the natural input gate capacitance formed between the gate electrode of the given NMOSFET (PMOSFET) and its substrate (NWell) underneath, with a gate dielectric in between, as described above.

When a voltage transient is transmitted to the input of the thin-oxide gates of MOSFETs 100, 101, 105, 106, this transient is coupled across the discrete capacitors 30, 31, 32, 33. Therefore, the thin oxide transistors 100, 101, 105, 106 are briefly turned on. The same transient is input to thick oxide transistors 110, 111, 115, 116 and those thick oxide transistors also begin to turn on; however the thick oxide transistors 110, 111, 115, 116 provide less current than do the thin oxide transistors 100, 101, 105, 106. Immediately after the thin oxide transistors 100, 101, 105, 106 turn on, resistors 20, 21, 22, 23 act to remove this transient to return the field across device pairs 100, 101, 105, 106, to a zero potential, at a decay rate defined by selected values of R and C, to turn off the thin oxide transistors 100, 101, 105, 106. Therefore, the thin oxide transistors are only on for a short period of time by the action of the RC devices 20–23 and 30–33. Thus, the thin oxide transistors are only on in parallel with the thick oxide transistors for the brief period of time necessary for transistor switching to be completed. Thereafter, the thin oxide transistors are turned off, to eliminate the high tunneling currents associated with the thin oxides and the thick oxide transistors remain on to provide the needed current path (in this case to ground). The capacitance C is the value of the input transient capacitor in series with the intrinsic gate capacitor, and R is the resistance of the resistors 30, 31 from gate to ground (or $V_{dd}$ in the case of PFETs).

The actual thicknesses of the different oxides and the decay rates are not absolute values. Instead, the invention uses one set of transistors that have oxide thicknesses that are less than the other set of transistors. Therefore, the invention is not limited to a specific size device or specific thickness of oxide. Similarly, the speed difference between the turning-on of the thin oxide devices and turning-on of the thick oxide devices will vary from technology to technology. An important feature of the invention in this regard is that the RC circuits are sized to accommodate for the differences in turn-on speeds and are selected so that the thin the oxide devices are only on for the period of time necessary to complete the transition. As mentioned above, this allows the invention to achieve high performance turn-on characteristics that are associated with the thin oxide devices yet, since the invention turns off the thin oxide devices as soon as the transition is completed, the invention does not sustain excessive tunneling currents associated with the thin oxide devices. Instead, once the thick oxide devices turn on fully and the thin oxide devices are turned off, the standby current is that associated with the small amount of tunneling through the thick oxide devices. Therefore, the invention is not limited to any specific ratio or timing relationship, but instead is applicable to all such relationships, as would be known by one ordinarily skilled in the art in view of this disclosure.

Figure 2:
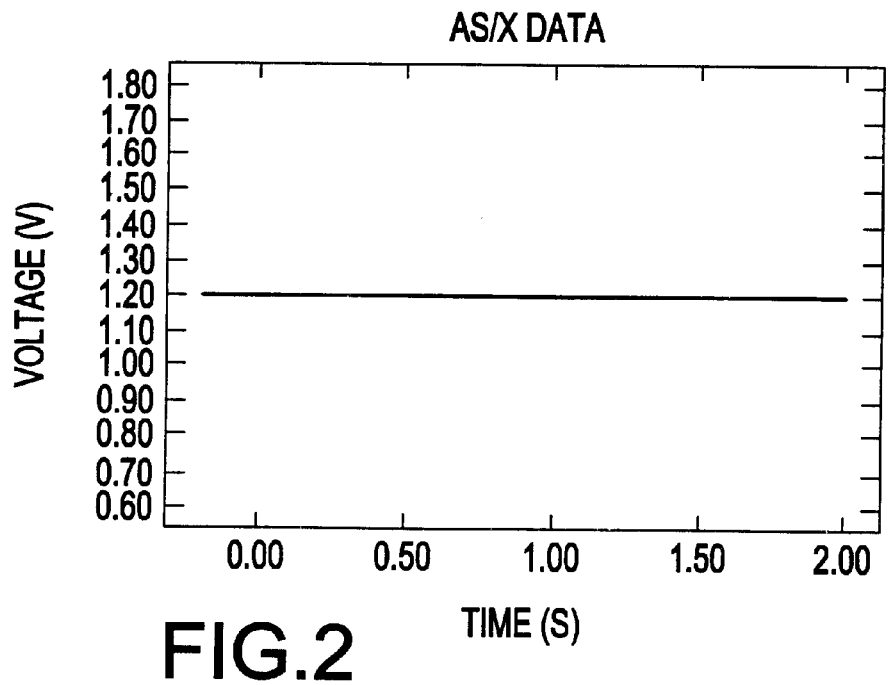
FIG. 2 is a waveform generated from a transient gate current switch circuit according to the present invention.
Figure 3:
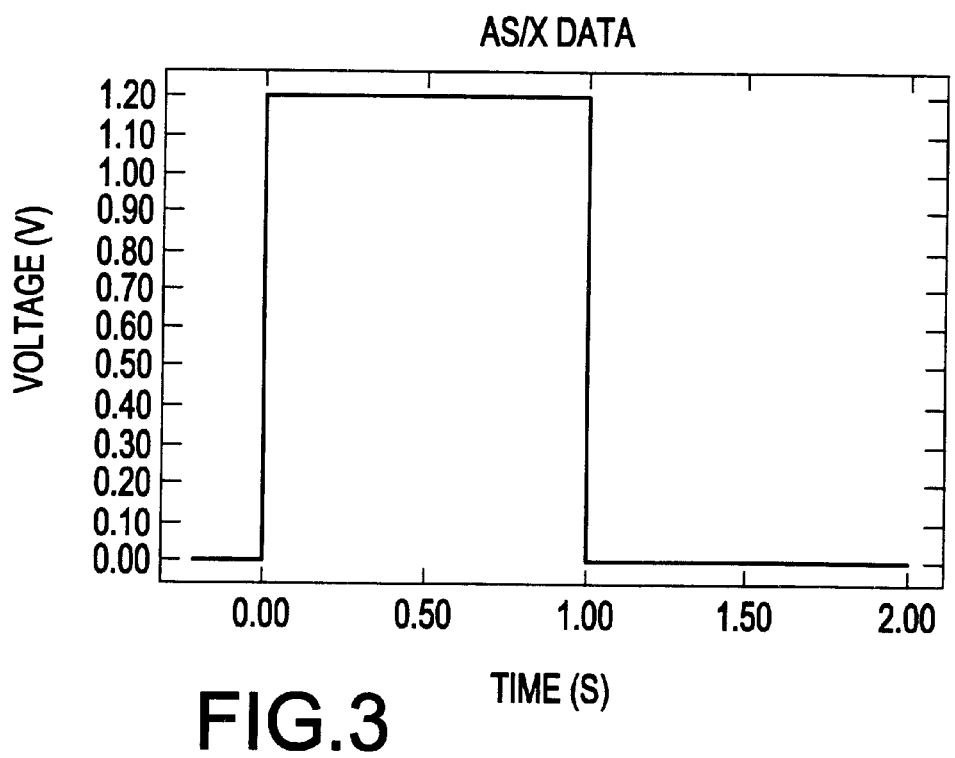
FIG. 3 is a waveform generated from a transient gate current switch circuit according to the present invention.
Figure 4:
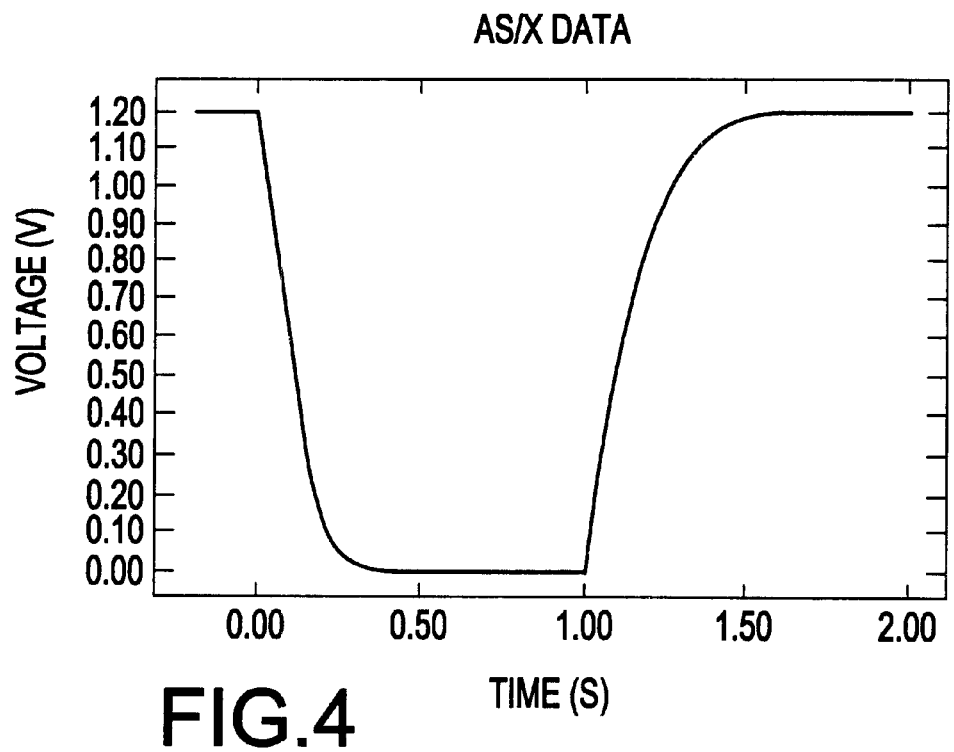
FIG. 4 is a waveform generated from a transient gate current switch circuit according to the present invention.
Figure 5:
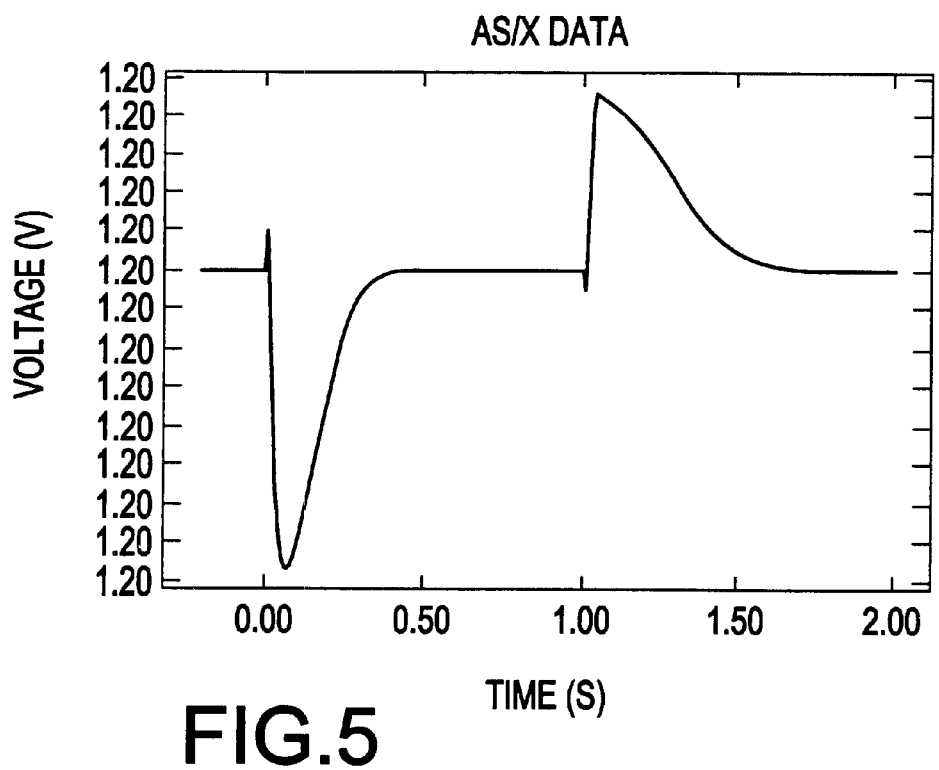
FIG. 5 is a waveform generated from a transient gate current switch circuit according to the present invention.
Figure 6:
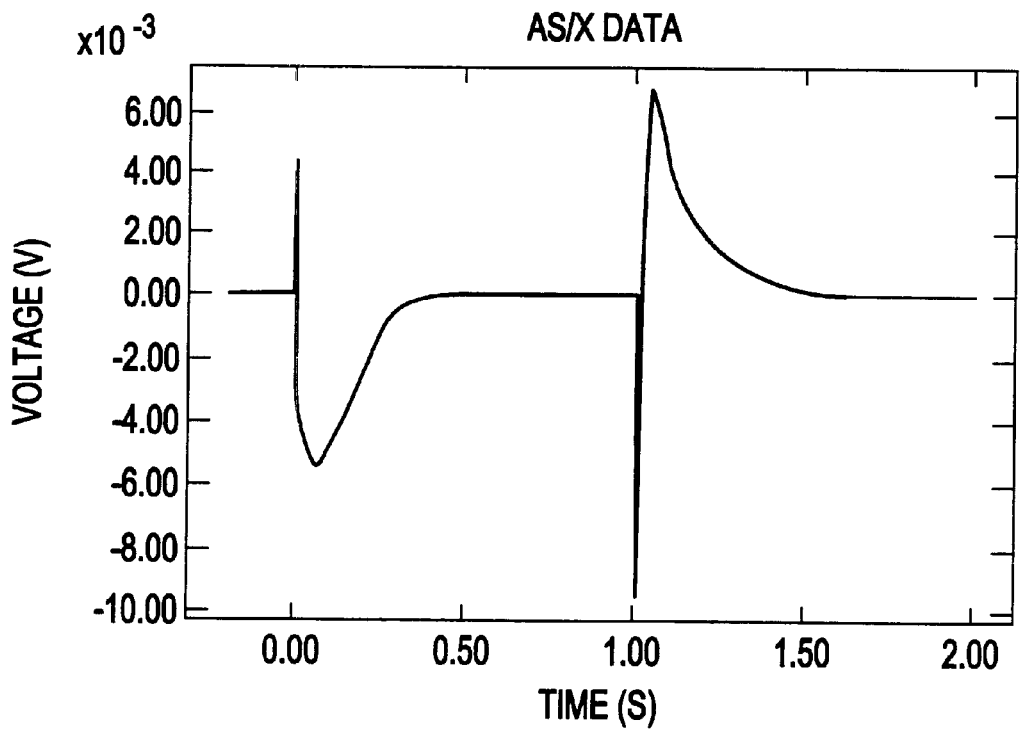
FIG. 6 is a waveform generated from a transient gate current switch circuit according to the present invention.
Figure 7:
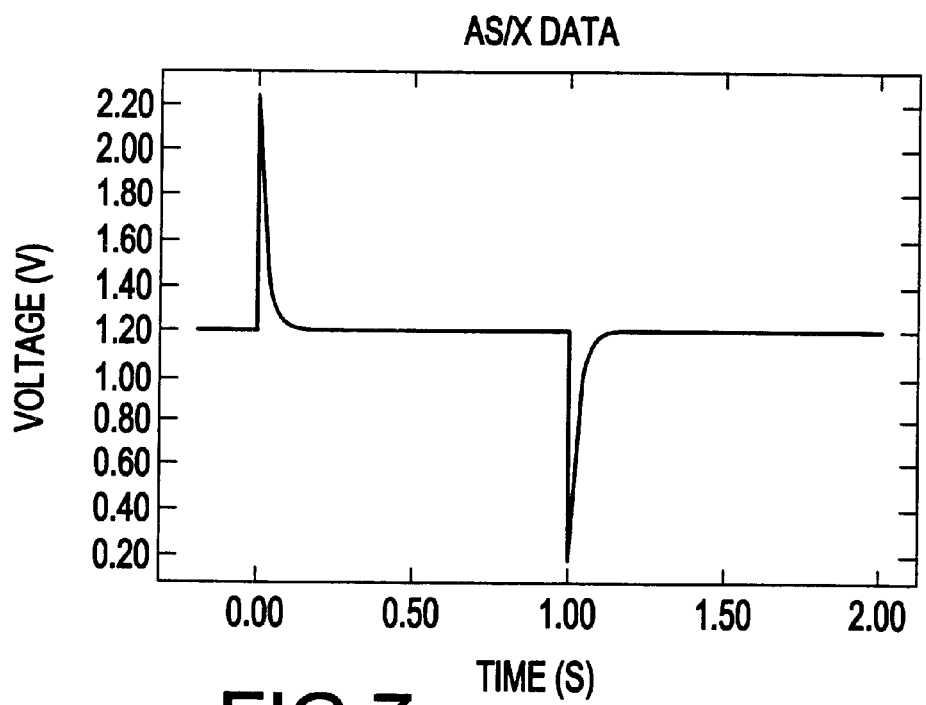
FIG. 7 is a waveform generated from a transient gate current switch circuit according to the present invention.
Figure 8:
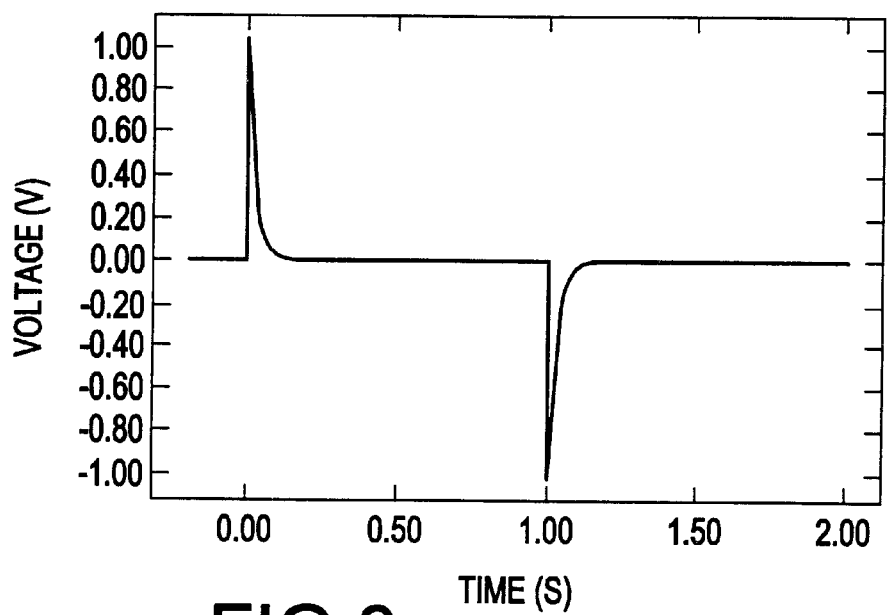
FIG. 8 is a waveform generated from a transient gate current switch circuit according to the present invention.
Figure 9:
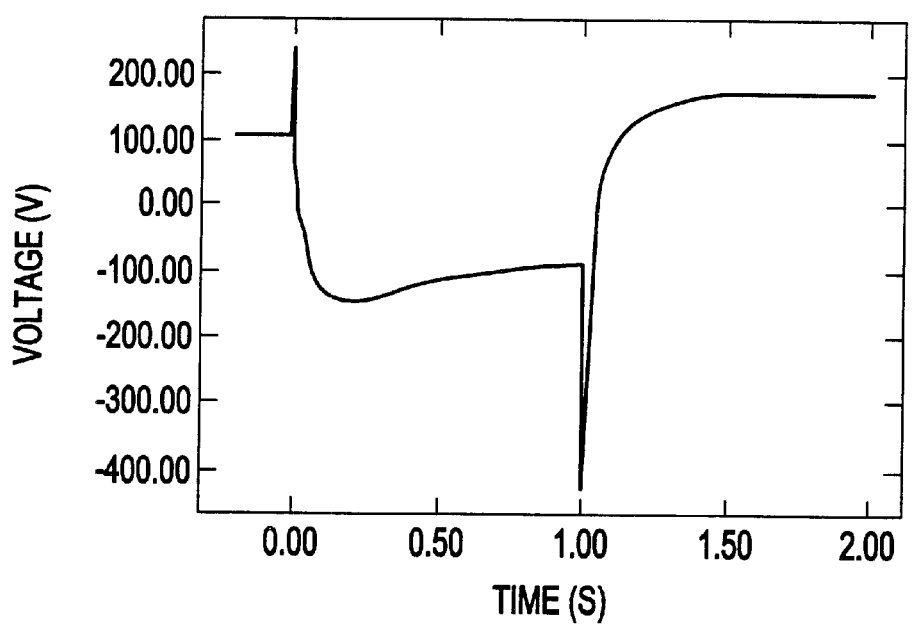
FIG. 9 is a waveform generated from a transient gate current switch circuit according to the present invention.
Figure 10:
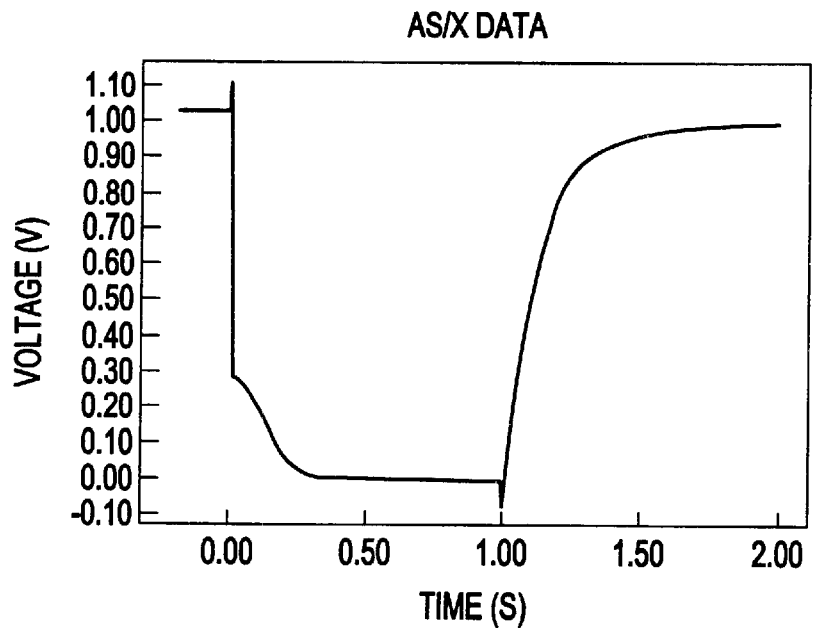
FIG. 10 is a waveform generated from a transient gate current switch circuit according to the present invention.

Next, FIGS. 2 through 10 display the results generated by the present invention. Namely, in analyzing the inputs presented to the gates, it is seen that inputs (nodes) A (FIG. 2), B (FIG. 3), and C (FIG. 4) are either level or switching inputs which remain at their potential for the whole cycle. For example, FIG. 2 illustrates the plot of voltage as a function of time at Node A, which is shown as a flat curve, with no slope, because Node A is grounded. FIG. 3 shows the results at Node B, which is a repeated square wave form, where there is a voltage drop from 1.20 V to 0 V at time 1 second. Similarly, FIG. 4 shows the plot of voltage at node C.

In FIGS. 5 through 10, there are shown various plots showing voltage as a function of time for the respective Nodes, AC1 (FIG. 5), AC2 (FIG. 6), BC1 (FIG. 7), BC2 (FIG. 8), and the thin and thick assemblies (MDTHN (FIG. 9), MDTHK (FIG. 10)). As shown in the drawings inputs (nodes) AC1, AC2, BC1, and BC2, have been converted to pulses with quick decays so that any tunneling currents through these gates are not sustained for very long. In this example, nodes AC1 and AC2 were held constant so pulse decay had already been completed. Node AC1, shown in FIG. 5 has a constant voltage at 1.20 V because the node variation is below the plotting precision used to generate the other waveforms. If it is assumed input A is held high at 1.20 V, then node AC1 must also be held near 1.20 V because it is directly coupled.

Again, FIGS. 2 through 10 display the normal NAND2 response of the thick and thin oxide assemblies to changing inputs. MDTHN and MDTHK (FIGS. 9 and 10, respectively) are the node names of the intermediate diffusions in the NMOS stack for thick and thin subassemblies. Although transients in the "don't care direction" swing above Vdd and below Gnd, they do not impede function of circuit.

Figure 11:
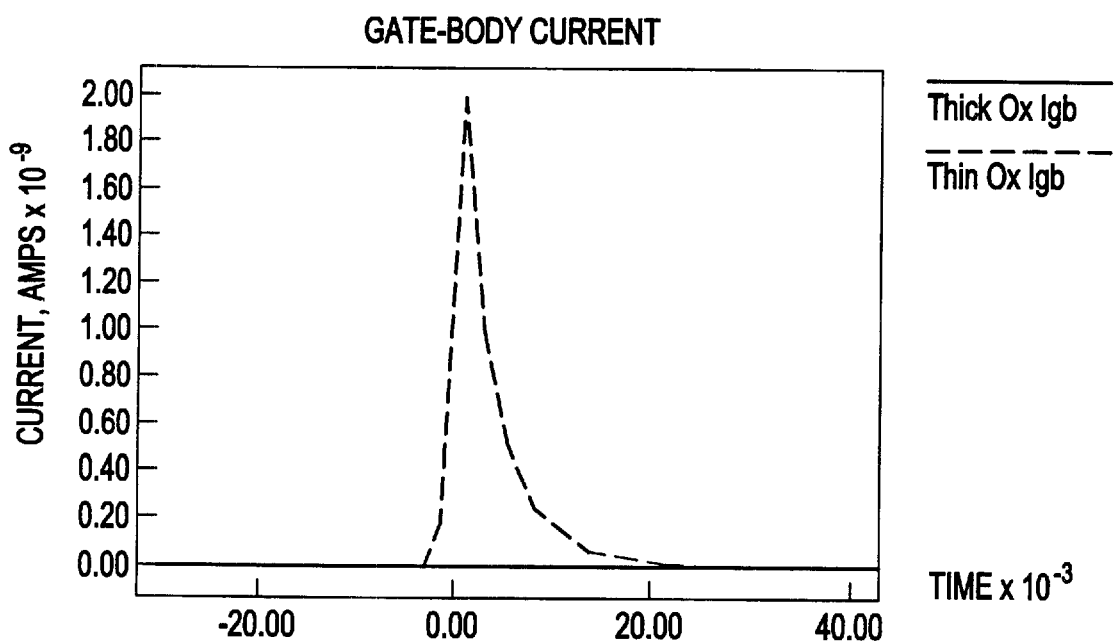
FIG. 11 is a waveform generated from a transient gate current switch circuit according to the present invention.

As shown in FIG. 11, since the capacitors couple transients in both the rising and falling directions, a spike of time constant R×C will appear at the gate electrode on both transitions. The spike in the desired direction quickly attenuates, reducing the tunneling current leakage seen. This is the low-to-high transition into an NMOSFET, or a high-to-low transition in the PMOSFET. This transition is the high-to-low edge presented to an NMOSFET, or the low-to-high edge presented to a PMOSFET. FIG. 11 further illustrates the results achieved by the present invention. Here, gate-oxide currents for the thick and thin N-type MOSFET devices 105, 106, 115, 116 in the separate subassemblies are shown for a rising B input. As is shown in FIG. 3, the excessive tunneling current associated with the thin oxide subassembly 5 is quickly mitigated (in approximately 20×10−3 seconds) by the RC devices 20–23 and 30–33, leaving the thick oxide subassembly 6 to complete and maintain the levels. In FIG. 3, Igb refers to gate current.

The power-delay product according to the present invention compared to a simple device NAND2 is virtually identical. This means that there is no penalty in implementing this invention. In additional embodiments, the device widths in the thick oxide subassembly 6 can be reduced, and the device width, capacitance, and power consumption may be allocated to the thin oxide assembly 5. This optimizes either the power consumption or performance. Any incremental active power increase from adding the thin oxide subassembly 5 will be easily offset by the DC power reduction.

Preferably, the present invention uses a dense capacitor. Furthermore, there is a direct trade-off of active power for passive power because each switching event now uses up AC Power ($C_{gate\ 1}$+Ccap)×$V^2$×f, which is greater than $C_{gate\ 2}$×$V^2$ but saves DC Power ($I_{gate}$×V. Thus, the present invention is an effective solution for trading active power for passive power production.

There are several benefits of the present invention. First, the present circuit provides for tunneling current control without sacrificing speed. Also, the present semiconductor integrated circuit design is very broad in its application and can be applied to dynamic logic families. Moreover, the present invention provides a simple, yet effective circuit which enhances the active power for passive power trade off.

While the invention has been described in terms of preferred embodiments, those skilled in the art will recognize that the invention can be practiced with modification within the spirit and scope of the appended claims.

What is claimed is:

1. A circuit comprising:
   a first set of transistors;
   a resistance-capacitance (RC) structure connected to said first set of transistors; and
   a second set of transistors operatively connected to said first set of transistors,
   wherein said first set of transistors and said second set of transistors perform the same logical function, and
   wherein said first set of transistors have thinner gate oxides than said second set of transistors.

2. The circuit of claim 1, wherein said RC structure turns off said first set of transistors after transistor switching is completed.

3. The circuit of claim 1, wherein said RC structure drains an electric field from said first set of transistors, such that said first set of transistors are on, in parallel with said second set of transistors, only during initial transistor switching.

4. The circuit of claim 1, wherein said first set of transistors and said second set of transistors share common inputs and outputs.

5. The circuit of claim 1, wherein said first set of transistors exhibit higher tunneling currents than said second set of transistors.

6. The circuit of claim 1, wherein said thinner gate oxides of said first set of transistors cause said first set of transistors to exhibit higher device currents than said second set of transistors.

7. The circuit of claim 1, wherein said RC structure comprises a capacitor connected to a gate of said first set of transistors and a resistor connected to said capacitor and to ground.

8. A circuit comprising:
   a first set of transistors;
   a resistance-capacitance (RC) structure connected to said first set of transistors; and
   a second set of transistors operatively connected to said first set of transistors,
   wherein said first set of transistors and said second set of transistors share common inputs and outputs, and
   wherein said first set of transistors have thinner gate oxides than said second set of transistors.

9. The circuit of claim 8, wherein said RC structure turns off said first set of transistors after transistor switching is completed.

10. The circuit of claim 8, wherein said RC structure drains an electric field from said first set of transistors, such that said first set of transistors are on, in parallel with said second set of transistors, only during initial transistor switching.

11. The circuit of claim 8, wherein said first set of transistors and said second set of transistors perform the same logical function.

12. The circuit of claim 8, wherein said first set of transistors exhibit higher tunneling currents than said second set of transistors.

13. The circuit of claim 8, wherein said thinner gate oxides of said first set of transistors cause said first set of transistors to exhibit higher device currents than said second set of transistors.

14. The circuit of claim 8, wherein said RC structure comprises a capacitor connected to a gate of said first set of transistors and a resistor connected to said capacitor and to ground.

15. A circuit comprising:
   a first set of transistors;
   a resistance-capacitance (RC) structure connected to said first set of transistors; and
   a second set of transistors operatively connected to said first set of transistors,
   wherein said first set of transistors and said second set of transistors perform the same logical function,
   wherein said first set of transistors have thinner gate oxides than said second set of transistors, and
   wherein said RC structure drains an electric field from said first set of transistors, such that said first set of transistors are on, in parallel with said second set of transistors, only during initial transistor switching.

16. The circuit of claim 15, wherein said RC structure turns off said first set of transistors after said initial transistor switching is completed.

17. The circuit of claim 15, wherein said first set of transistors and said second set of transistors share common inputs and outputs.

18. The circuit of claim 15, wherein said first set of transistors exhibit higher tunneling currents than said second set of transistors.

19. The circuit of claim 15, wherein said thinner gate oxides of said first set of transistors cause said first set of transistors to exhibit higher device currents than said second set of transistors.

20. The circuit of claim 15, wherein said RC structure comprises a capacitor connected to a gate of said first set of transistors and a resistor connected to said capacitor and to ground.

* * * * *